United States Patent
Da Silva et al.

(10) Patent No.: US 12,510,705 B2
(45) Date of Patent: Dec. 30, 2025

(54) LIGHTING DEVICE AND VEHICLE COMPONENT COMPRISING SUCH A LIGHTING DEVICE

(71) Applicant: Faurecia Clarion Electronics Europe, Paris (FR)

(72) Inventors: Edouard Da Silva, Herblay (FR); Romain Feilleux, Epinay sur Seine (FR); James Gourlay, Dumbarton (GB)

(73) Assignee: Faurecia Clarion Electronics Europe, Paris (FR)

( * ) Notice: Subject to any disclaimer, the term of this patent is extended or adjusted under 35 U.S.C. 154(b) by 47 days.

(21) Appl. No.: 18/293,770

(22) PCT Filed: Jul. 29, 2022

(86) PCT No.: PCT/EP2022/071328
§ 371 (c)(1),
(2) Date: Jan. 30, 2024

(87) PCT Pub. No.: WO2023/006941
PCT Pub. Date: Feb. 2, 2023

(65) Prior Publication Data
US 2025/0231336 A1 Jul. 17, 2025

(30) Foreign Application Priority Data
Jul. 30, 2021 (FR) ...................................... 2108337

(51) Int. Cl.
*F21V 8/00* (2006.01)
*F21V 19/00* (2006.01)
(Continued)

(52) U.S. Cl.
CPC .......... *G02B 6/0068* (2013.01); *F21V 19/002* (2013.01); *G02B 6/0073* (2013.01);
(Continued)

(58) Field of Classification Search
CPC .... G02B 6/0068; G02B 6/0073; F21V 19/002
See application file for complete search history.

(56) References Cited

U.S. PATENT DOCUMENTS

2013/0285083 A1* 10/2013 Sun ...................... H01L 25/0753
257/89
2017/0254518 A1* 9/2017 Vasylyev .................. F21V 9/02
(Continued)

FOREIGN PATENT DOCUMENTS

EP 3460844 A2 3/2019

OTHER PUBLICATIONS

French Search Report corresponding to French Application No. FR 2108337, dated Apr. 13, 2022, 2 pages.
(Continued)

*Primary Examiner* — Evan P Dzierzynski
(74) *Attorney, Agent, or Firm* — Reising Ethington P.C.

(57) ABSTRACT

A lighting device having a support supporting first light emitting diodes and second light emitting diodes each having a light emitting surface, wherein the light emitting surface of each first light emitting diode has a first area and the light emitting surface of each second light emitting diode has a second area, the second area being strictly lower than the first area.

17 Claims, 4 Drawing Sheets

(51) Int. Cl.
*H10H 29/01* (2025.01)
*H10H 29/30* (2025.01)
*H10H 29/85* (2025.01)
*H10H 29/855* (2025.01)
*B60Q 3/62* (2017.01)
*F21W 106/00* (2018.01)
*F21Y 105/12* (2016.01)
*F21Y 105/16* (2016.01)
*F21Y 115/10* (2016.01)

(52) U.S. Cl.
CPC ......... *G02B 6/0091* (2013.01); *H10H 29/012* (2025.01); *H10H 29/0363* (2025.01); *H10H 29/352* (2025.01); *H10H 29/8508* (2025.01); *H10H 29/855* (2025.01); *B60Q 3/62* (2017.02); *F21V 2200/00* (2015.01); *F21W 2106/00* (2018.01); *F21Y 2105/12* (2016.08); *F21Y 2105/16* (2016.08); *F21Y 2115/10* (2016.08)

(56) References Cited

U.S. PATENT DOCUMENTS

| | | | | |
|---|---|---|---|---|
| 2018/0219147 A1* | 8/2018 | Ogata | .................. | F21V 29/502 |
| 2018/0254264 A1* | 9/2018 | Martin | .................. | H01L 25/167 |
| 2019/0097094 A1* | 3/2019 | Han | .................. | H10H 20/8512 |
| 2020/0132997 A1* | 4/2020 | Ouderkirk | ........... | H01L 25/0753 |

OTHER PUBLICATIONS

International Search Report and Written Opinion for PCT/EP2022/071328, dated Nov. 8, 2022, 10 pages.

* cited by examiner

LIGHTING DEVICE AND VEHICLE COMPONENT COMPRISING SUCH A LIGHTING DEVICE

TECHNICAL FIELD

The present invention relates to the technical field of lighting devices, in particular lighting devices comprising light emitting diodes.

BACKGROUND

It is possible to use lighting devices in vehicles, in particular in interior trims of automotive vehicle. Such lighting device are for example configured for ambient lighting, e.g. on dashboards, ceilings, door panels or foot wells.

Lighting devices can also be used in any type of display screen, such as display screens for smartphones, televisions, personal computer monitors, laptops or vehicle cockpit or vehicle infotainment system.

SUMMARY

One of the aims of the invention is to propose a lighting device with enhanced capabilities.

To this end, the invention proposes a lighting device comprising a support supporting first light emitting diodes and second light emitting diodes each having a light emitting surface, wherein the light emitting surface of each first light emitting diode has a first area and the light emitting surface of each second light emitting diode has a second area, the second area being strictly lower than the first area.

The lighting device comprising first light emitting diodes and second light emitting diodes with light emitting surfaces of differentiated areas allows obtaining a versatile lighting device that can for example be provided, on a same surface, with regions with different diode densities and difference functions.

In specific embodiments, the lighting device comprises one or several of the following features, taken individually or in any technically feasible combination:
- the support has a first lighting region in which first light emitting diodes are provided and a second lighting region in which the second light emitting diodes are provided, the first lighting region and the second lighting region being distinct;
- the first light emitting diodes are provided in the first lighting region with a first density and the second light emitting diodes are provided in the second lighting region with a second density strictly higher than the first density;
- the second light emitting diodes define a display region configured for displaying images, in particular dynamic images;
- the first light emitting diodes define a low-definition display region and the second light emitting diodes define a high-resolution display region;
- the support comprises a light guiding layer, the first light emitting diodes and the second light emitting diodes being covered and/or embedded in the light guiding layer;
- the support comprises a base layer supporting the first light emitting diodes and the second light emitting diodes, the light guiding layer covering the base layer;
- the support is flexible.
- the support is in the shape of a plate;
- the second light emitting diodes are integrated into one or several lighting module(s), each lighting module comprising a substrate and a plurality of second light emitting diodes supported by the substrate, the substrate being secured to the support;
- the second light emitting diodes of each lighting module are distributed in a matrix arrangement on the substrate;
- the lighting device comprises several lighting modules distributed on the support in a matrix arrangement;
- the first area is comprised between 0.001 and 1 mm² and/or the second area is comprised between 0.0001 and 0.001 mm².

The invention also relates to a lighting system comprising one or several lighting device(s) as defined above.

The invention further relates to digital display screen comprising one or several lighting device(s) as defined above and/or a lighting system as defined above.

The invention still relates to a vehicle component comprising one or several lighting device(s) one or several lighting device(s) as defined above and/or a lighting system as defined above.

BRIEF DESCRIPTION OF THE DRAWINGS

The invention and its advantages will be better understood upon reading the following description given solely by way of non-limiting examples and made with reference to the appended drawings in which.

DETAILED DESCRIPTION

Figure 1:
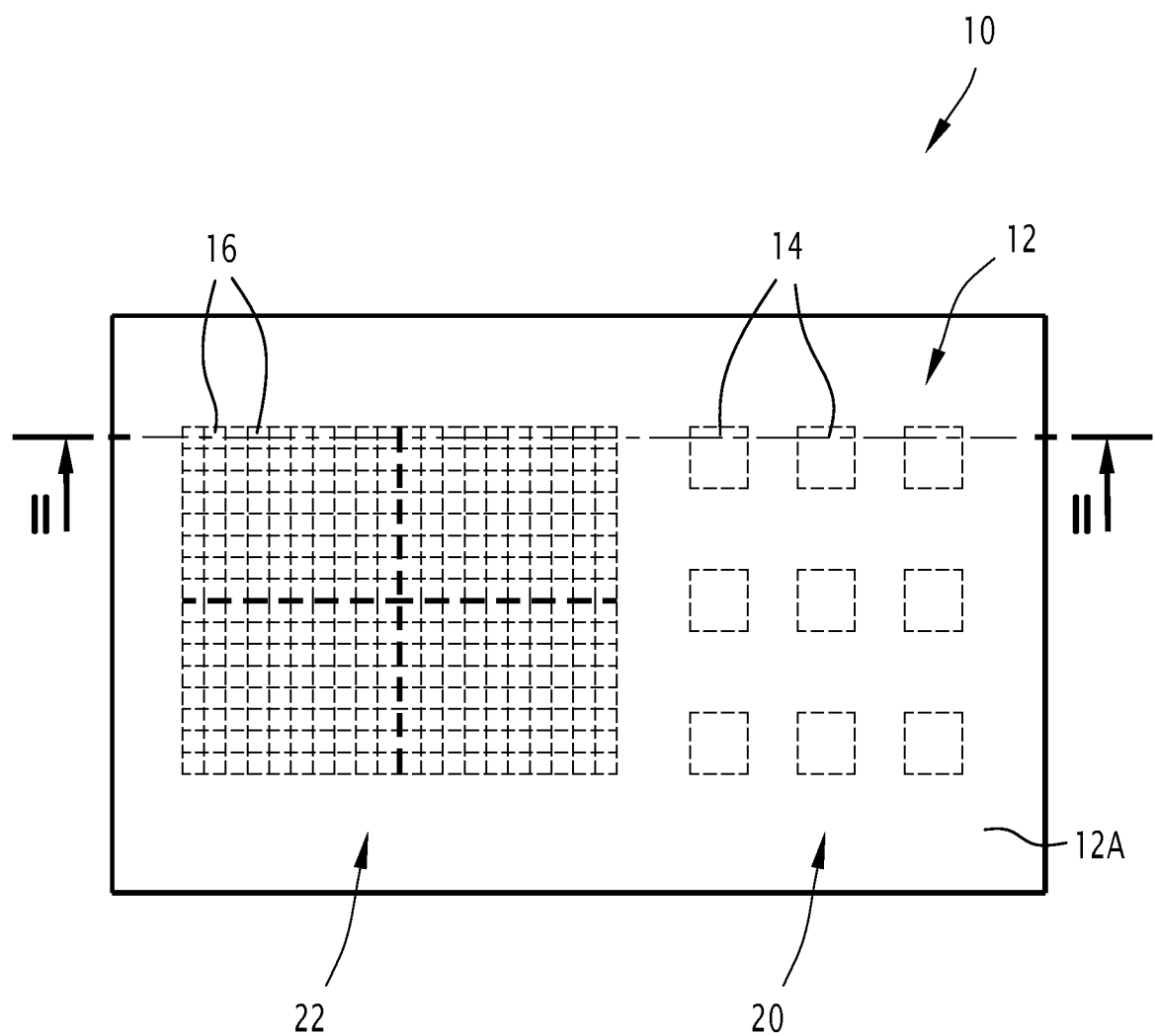
FIG. 1 is a top view of a lighting device.
Figure 2:
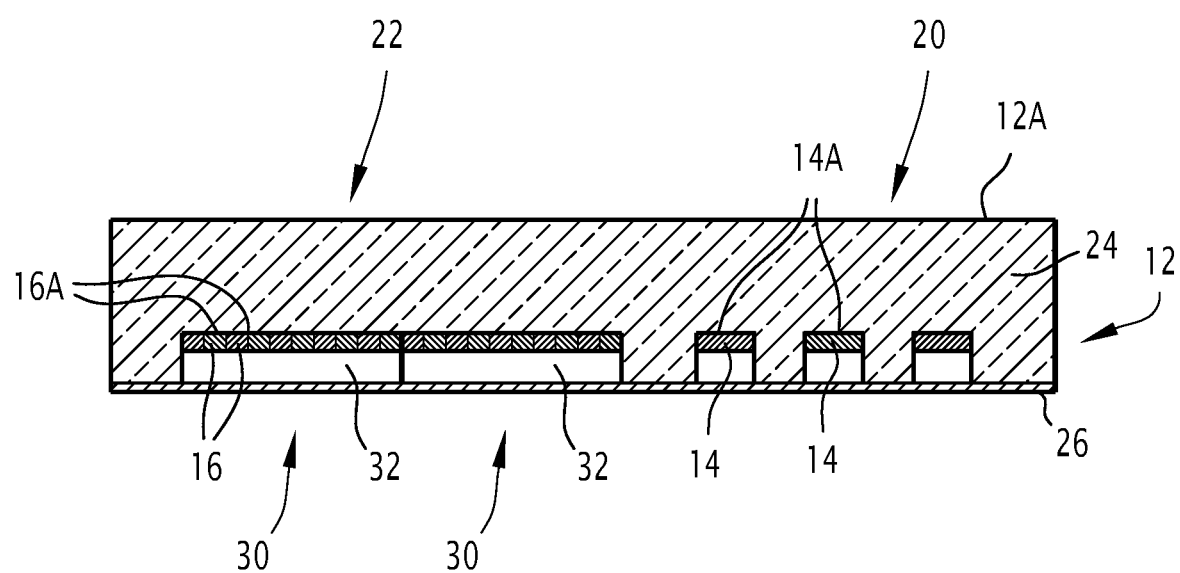
FIG. 2 is a cross-sectional view of the lighting device of FIG. 1 taken along II-II on FIG. 1.

As illustrated on FIGS. 1 and 2, a lighting device 10 comprises a support 12 supporting first light emitting diodes 14 and second light emitting diodes 16.

The support 12 has a front surface 12A and a rear surface 12B. The front surface 12A is preferably intended to be visible by the user.

The support 12 is for example plate shaped, the front surface 12A and the rear surface 12B being the two opposed faces of the support 12.

Advantageously, the support 12 is flexible. In particular, the support 12 is flexible such as to be conformable to the shaped of the surface of an object onto which the support 12 is attached.

The first light emitting diodes 14 and the second light emitted diodes 16 are configured for emitting light. The first light emitting diodes 14 and the second light emitted diodes 16 each comprise a light emitting surface 14A, 16A. The light emitting surface 14A, 16A of each one of the first light emitting diodes 14 and the second light emitting diodes 16 is the surface of that first light emitting diode 14 or second light emitting diode 16 that emits light upon operation of the light emitting diodes.

The first light emitting diodes 14 and the second light emitted diodes 16 are preferably provided on the support 12 such as to emit light on the front surface 12A of the support 12.

The light emitting surface 14A of each first light emitting diode 14 has a first area A1 and the light emitting surface 16A of each second light emitting diode 16 has a second area A2, the second area A2 being strictly lower than the first area A1.

The term "area" designates here the quantity that expresses the extent of a surface.

In other words, the second light emitting diodes 16 are of "smaller size" than the first light emitting diodes 14.

In one example, the first area A1 is comprised between 0.001 and 1 mm$^2$ and/or the second area A2 is comprised between 0.0001 and 0.001 mm$^2$.

The first light emitting diodes 14 are for example so-called LED or mini-LED devices. Such LED or Mini-LED devices are usually packaged as Surface Mount Devices (SMD).

The second light emitting diodes 16 are for example so-called "micro-LED" or "µLED". Micro-LED are usually packaged as "bare-die" or individual chips.

In one example, the front surface 12A of the support 12 has a first region 20 in which the first light emitting diodes 14 are provided and a second region 22 in which the second light emitting diodes 16.

In one example, the first light emitting diodes 14 are provided in the first region 20 with a first density D1 and the second light emitting diodes 16 are provided in the second region 22 with a second density D2 strictly higher that the first density D1.

The density of light emitting diodes in a region of the front surface 12A of the support 12 is defined as the number of light emitting diodes per area unit.

As the second light emitting diodes 16 are of smaller size than the first light emitting diodes 14, it is thus possible to arrange the second light emitting diodes 16 with a second density D2 that is strictly higher than the first density D1.

For example, the first density D1 is inferior to 10 diodes/cm2 and/or the second density D2 is superior to 10 diodes/cm2.

Different diode sizes and different diode densities can serve different purposes or functions in the light device 10.

Typically, the higher density support display functionality and the lower density supports lighting functionality.

A low diode density region of the support 12 is for example used for ambient lighting purposes and a high diode density region of the support 12 is for example used for displaying digital images, in particular images containing information to be read by the user.

In one example, the first light emitting diodes 14 are configured for emitting ambient light in the first region 20.

In one example, the second light emitting diodes 16 are configured for displaying digital images, in particular dynamic images, in the second region 22. The second region 22 thus defines a display region for displaying images, in particular dynamic images.

In one example, the first light emitting diodes 14 define a low definition display region (the first region 20) and the second light emitting diodes 16 define a high-resolution display region (the second region 22).

In one example, first light emitting diodes 14 are distant from one another. This is applicable notably when the first region 20 is intended for ambient lighting.

The second light emitting diodes 16 are preferably joined, in particular in view of defining a display region for displaying dynamic images.

In one embodiment or operating mode, the first light emitting diodes 14 are controlled either independently from the second light emitting diodes 16, whereby the light emitted by the first light emitted diodes 14 is independent of light or images displayed by the second light emitting diodes.

In one embodiment or operating mode, the first light emitting diodes 14 and the second light emitting diodes 16 are controlled jointly or in a linked manner to form a global content, for example with associating contextually dynamic images (displayed e.g. by the second light emitting diodes 16) and ambient lighting (emitted e.g. by the first light emitting diodes 14).

In a particular embodiment in which the second light emitting diodes 16 define a display region for displaying dynamic colour images, the second light emitting diodes 16 are associated in triplets for defining colour image pixels, the three second light emitting diodes 16 of each triplet having different colours (e.g. red/green/blue).

The first light emitting diodes 14 and the second light emitting diodes 16 are provided on the same support 12.

In one example, the support 12 comprises a light guiding layer 24, the first light emitting diodes 14 and the second light emitting diodes 16 being covered by and/or embedded in the light guiding layer 24. The light guiding layer 24 defines for example the front surface 12A of the support 12.

The light-guiding layer 24 is transparent and provides an optical function of distributing light between the light emitting diodes.

Light extraction features are preferably provided on the surface or embedded within the light guiding layer 24. The light extraction features can be refractive or reflective or scattering.

The light-guiding layer 24 is for example a transparent polymer commonly used to encapsulate LED devices, such as silicone, polyurethane, epoxy, polycarbonate or acrylic/PMMA.

The first light emitting diodes 14 and the second light emitting diodes 16 covered by and/or embedded in the light guiding layer 24 are not exposed to surrounding atmosphere.

The light guiding layer 24 is made in a light transmitting material that allows light generated by the first light emitting diodes 14 and the second light emitting diodes 16 to emerge from the light guiding layer 24 and in fine support 12.

The continuity of light guiding layer 24 enhances the seamless transition from the first region 20 to the second region 22 and effectively blends the areas of different densities of light emitting diodes together.

In one example, the support 12 comprises a base layer 26 onto which the first light emitting diodes 14 and the second light emitting diodes 16 are secured, the light guiding layer 24 covering the base layer 26.

When the base layer 26 and the light-guiding layer 24 are both transparent then a composite light-guide will be formed. Then the light will be guided between the light emitting diodes inside both layers.

When the base layer 26 is not transparent, then reflection or absorption will occur at the light-guiding layer 24 and base layer 26 interface. This might limit the achievable special homogeneity or optical efficiency. To avoid or mitigate this, optionally, a low refractive index material can be introduced at this interface between the light-guiding layer 24 and the base layer 26.

When the support 12 is flexible, the light guiding layer 24 and, if applicable, the base layer 26 is or are flexible such as to impart flexibility to the support 12.

Advantageously, the second light emitting diodes 16 are integrated into at least one lighting module 30, each lighting module 30 comprising a substrate 32 and a plurality of second light emitting diodes 16 supported by the substrate 32, the substrate 32 being attached to the support 12.

The substrate 32 of each lighting module 30 is for example in the shape of a plate, the second light emitting diodes 16 being distributed onto one face of the plate shaped substrate 32.

The substrate 32 is for example flexible. Alternatively, the substrate 32 is rigid.

The substrate 32 could be a printed circuit board (PCB) made from glass-reinforced laminate epoxy such as FR4, polyimide, polyethylene naphtalate (PEN), polyethylene therepthalate (PET) or other material commonly used in the industry.

The substrate 32 could support passive or active light emitting diode circuitry, such as copper or silver circuits or thin film transistor circuits (or TFT circuits), as commonly used in the industry.

The lighting device 10 advantageously comprises a plurality of lighting modules 30 attached to the support 12.

Preferably, in each lighting module 30, the second light emitting diodes 16 are distributed in a matrix arrangement on the substrate 32.

As illustrated on FIG. 1, each lighting module 30 comprises second light emitting diodes 16 typically arranged in a N×M matrix, N and M being integers that are preferably equal or superior to eight. N and M are equal or different.

A plurality of lighting modules 30, in particular identical lighting modules 30, can be placed side-by-side on the support 12 to form a lighting region or display region of greater area than that or each lighting module 30.

In one example in which the second light emitting diodes 16 define an image display region, the lighting device 10 comprises a plurality of lighting modules 30, in particular identical lighting modules 30, placed side-by-side on the support 12 to form a display region of greater area than the area of each lighting module 30.

In one example, the lighting device 10 comprises several lighting modules distributed on the support 12 in a matrix fashion, in particular to define a display region, preferably a high-resolution display region.

As illustrated on FIG. 1, the lighting device 10 comprises a plurality of lighting module 30 arranged in a P×Q matrix, P and Q being integers that are preferably equal or superior to 2. P and Q are equal or different.

In one example, a plurality of lighting modules 30 placed side-by-side, in particular in a matrix arrangement, are joined. This is preferable when the plurality of lighting modules 30 define a dynamic image display region.

The first light emitting diodes 14 of greater size than the second light emitting diodes 16 are provided for example individually and individually attached to the support 12.

Alternatively, the first light emitting diodes 14 are integrated in one or several lighting modules similarly to the second light emitting diodes 16.

Figure 3:
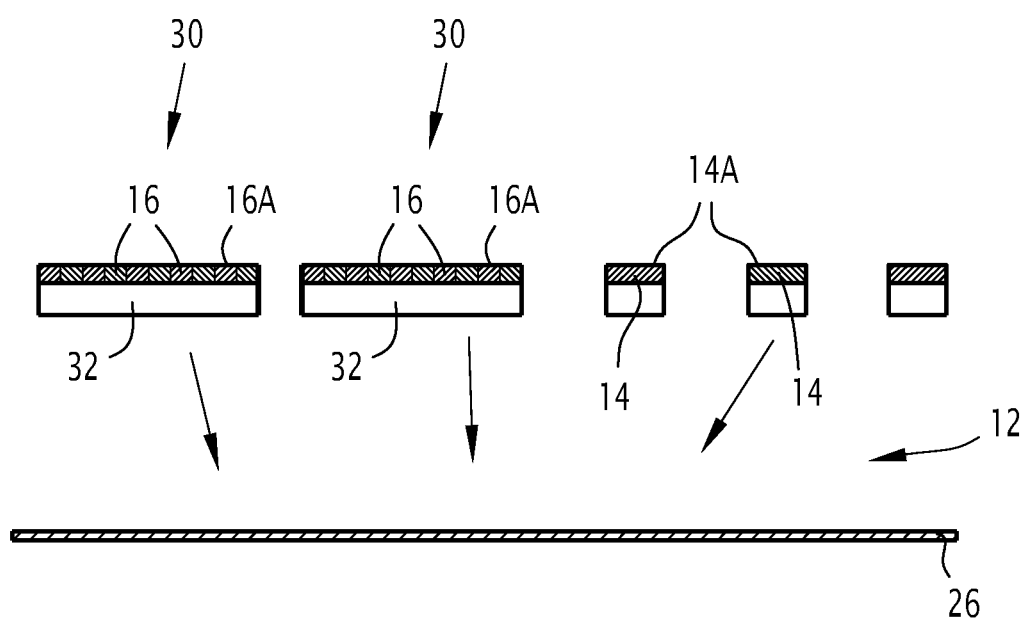
FIG. 3 illustrates a process of manufacturing the lighting device of FIG. 1.

As illustrated on FIG. 3, a process for manufacturing the lighting device 10 provided with a support 12 comprising a base layer 26 and a light guiding layer 24, first light emitting diodes 14 and one or several lighting modules 30 integrating the second light emitting diodes 16 comprises the steps of obtaining the base layer 26, obtaining the lighting modules 30 and the first light emitting diodes 14, fastening the lighting modules 30 and the first light emitting diodes 14 to the base layer 26 (FIG. 3) and then providing the light guiding layer 24 on top of the base layer 26 with covering and/or embedding the lighting modules 30 and the first light emitting diodes 14 (FIG. 2). The light guiding layer 24 may be obtained separately and then applied onto the base layer 26 or it may be overmoulded or cast onto the base layer 26

Figure 4:
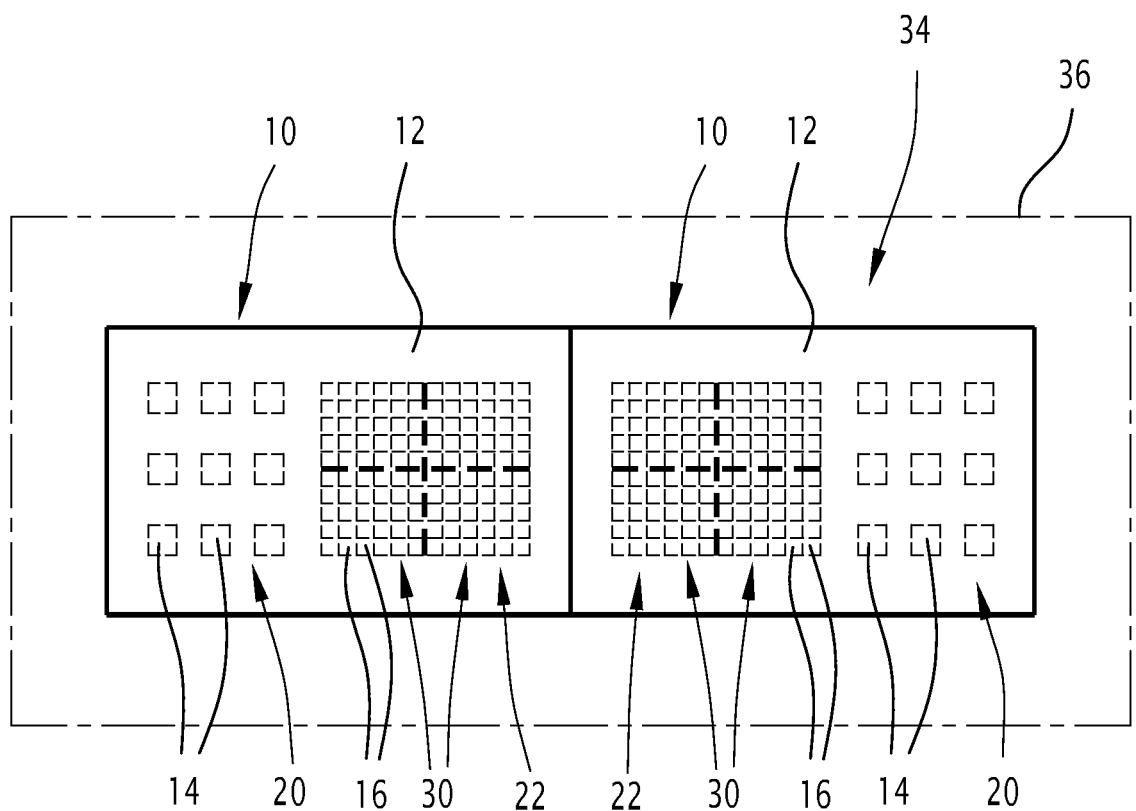
FIG. 4 is a top view of a light system incorporating a plurality of lighting devices.

As illustrated on FIG. 4, the lighting device 10 may be integrated in a lighting system 34 comprising one or several lighting device(s) 10, in particular several lighting devices 10 assembled together.

The lighting system 34 is for example of modular construction, each lighting device 10 defining a respective module of the lighting system 34.

In one example, the lighting system 34 in integrated in component 36, in particular a component of vehicle, for example an automotive vehicle.

The component 36 is for example a vehicle interior trim, e.g. a dashboard, a door panel or a ceiling.

The component 36 could be also a digital display screen which integrates the lighting system 34 as a backlighting element, this digital display screen being able to be integrated in a vehicle, or in any other domain, such as in a smartphone or a television.

The component 36 could also be a component of a digital display screen for displaying digital images, such as a display screen of smartphone, a television, a personal computer monitor, a laptop, a vehicle cockpit display or vehicle infotainment system display.

Owing to the invention, it is possible to provide a lighting device 10 that is versatile and can be designed with different lighting regions including a first lighting region with first light emitting diodes 14 of larger size and a second lighting region with second light emitting diodes 16 of smaller size.

The first lighting region can be designed for ambient lighting or low definition display and the second lighting region can be designed for ambient lighting or high definition display.

The lighting device 10 can be obtained easily and at low cost, in particular with using one or several lighting module (s) 30 integrating a plurality of second light emitting diode 16 attached onto a substrate 32, in particular one or several lighting module(s) 30 each integrating a plurality of second light emitting diode 16 provided as μLEDs.

The invention claimed is:

1. A lighting device comprising a support supporting first light emitting diodes and second light emitting diodes each having a light emitting surface, each first light emitting diode being individually attached to the support, wherein the light emitting surface of each first light emitting diode has a first area and the light emitting surface of each second light emitting diode has a second area, the second area being smaller than the first area, wherein the second light emitting diodes are integrated into a plurality of lighting modules positioned adjacent to one another on the support to form a lighting region having an area greater than an area of each lighting module, each lighting module comprising a substrate and a plurality of second light emitting diodes supported by the substrate, the substrate being secured to the support.

2. The lighting device according to claim 1, wherein the support has a first lighting region in which first light emitting diodes are provided and a second lighting region in which the second light emitting diodes are provided, the first lighting region and the second lighting region being distinct.

3. The lighting device according to claim 2, wherein the first light emitting diodes are provided in the first lighting region with a first density and the second light emitting diodes are provided in the second lighting region with a second density higher than the first density.

4. The lighting device according to claim 1, wherein the second light emitting diodes define a display region configured for displaying images, in particular dynamic images.

5. The lighting device according to claim 1, wherein the first light emitting diodes define a low-definition display region and the second light emitting diodes define a high-resolution display region.

6. The lighting device according to claim 1, wherein the support comprises a light guiding layer, the first light emitting diodes and the second light emitting diodes being covered and/or embedded in the light guiding layer.

7. The lighting device according to claim 6, wherein the support comprises a base layer supporting the first light emitting diodes and the second light emitting diodes, the light guiding layer covering the base layer.

8. The lighting device according to claim 1, wherein the support is flexible.

9. The lighting device according to claim 1, wherein the support is in the shape of a plate.

10. The lighting device according to claim 1, wherein the plurality of lighting modules comprises several lighting modules.

11. The lighting device according to claim 10, wherein the several lighting modules are distributed on the support in a matrix arrangement.

12. The lighting device according to claim 1, wherein the second light emitting diodes of each lighting module are distributed in a matrix arrangement on the substrate.

13. A lighting system comprising one or more lighting device(s) according to claim 1.

14. A digital display screen comprising the lighting system according to claim 13.

15. A vehicle component comprising the lighting system according to claim 13.

16. A digital display screen comprising one or more lighting device(s) according to claim 1.

17. A vehicle component comprising one or more lighting device(s) according to claim 1.

\* \* \* \* \*